US006052049A

United States Patent [19]

Blakesley

[11] Patent Number: 6,052,049

[45] Date of Patent: Apr. 18, 2000

[54] FLEXIBLE FILM WITH A NON-TENSIONED ELECTRICAL CIRCUIT MOUNTED THEREON

[75] Inventor: Patrick B. Blakesley, Goshen, Ind.

[73] Assignee: CTS Corporation, Elkhart, Ind.

[21] Appl. No.: 08/755,918

[22] Filed: Sep. 13, 1996

[51] Int. Cl.[7] .................... H01L 10/32

[52] U.S. Cl. .................... 338/162; 338/211; 338/184; 338/125

[58] Field of Search .................... 338/162, 184, 338/118, 120, 125, 210, 211, 92

[56] References Cited

U.S. PATENT DOCUMENTS

| | | | |
|---|---|---|---|
| 3,457,537 | 7/1969 | Hines . | |
| 3,714,568 | 1/1973 | Ridings, Jr. | 324/126 |
| 4,355,293 | 10/1982 | Driscoll . | |
| 4,430,634 | 2/1984 | Hufford et al. . | |
| 4,435,691 | 3/1984 | Ginn . | |
| 4,621,250 | 11/1986 | Echasseriau et al. | 338/162 |
| 4,643,497 | 2/1987 | Oelsch | 439/77 |
| 4,841,626 | 6/1989 | Griebel | 29/620 |
| 4,928,082 | 5/1990 | Yagi et al. | 338/174 |
| 5,133,321 | 7/1992 | Hering et al. . | |
| 5,309,134 | 5/1994 | Ridge . | |
| 5,385,068 | 1/1995 | White et al. . | |

*Primary Examiner*—Teresa J. Walberg
*Assistant Examiner*—Karl Easthom
*Attorney, Agent, or Firm*—Michael W. Starkweather; Dan Tychonievich

[57] ABSTRACT

A flexible element for use in a rotary position sensor or the like having the direction of electrical traces on one surface of the element altered without putting the traces into tension. The directional change is accomplished by partially splitting the flexible element and continuing an electrical trace from one side of the split back along the other side. The invention makes it possible to decrease the size for a given operational angle of mechanically variable resistors without sacrificing quality or reliability.

17 Claims, 3 Drawing Sheets

FLEXIBLE FILM WITH A NON-TENSIONED ELECTRICAL CIRCUIT MOUNTED THEREON

BACKGROUND OF THE INVENTION

1. Field of the Invention

The present invention pertains to flexible films with electrical parts like traces mounted thereon. Particularly, the film of the present invention can be used in the manufacturing of a novel mechanically variable resistor for use as a rotary position sensor.

2. Description of Related Art

Flexible films have been known for years. A common use of flexible films is to use them as carriers for electrical circuits. A flexible film electrical circuit can consist of conductors only or it can include other electrical components such as resistors.

One use of flexible films is as a component in mechanically variable resistors. Mechanically variable resistors have been produced in a variety of configurations and have innumerable applications. One significant use of variable resistors is as a component in a manufacturing sensor, like a position sensor. Position sensors may be used to determine the relative location of an item that is being moved.

As in the electronics industry, there has been a continuing trend toward smaller sensors that deliver the same or better performance than larger predecessors. However, in the prior art to date, there are factors that can limit the minimum achievable size of variable resistor type position sensors. The limitations are particularly acute where flexible elements are incorporated into the package.

Many prior art resistors incorporate flexible elements. Typically, the flexible elements are located within a housing or other structure. An example of the prior art package designs is given in U.S. Pat. No. 4,355,293, incorporated herein by reference. Many other patents, including U.S. Pat. Nos. 4,430,634 and 4,435,691, incorporated herein by reference, illustrate the use of flexible film elements. Each of these prior art patents illustrate an element that is flexible and retained in position by the package and termination. The element is wrapped in a generally cylindrical form, concentric about the rotor. The element may circle partly around, completely around, or more than 360 degrees around the rotor.

Somewhere within the sensor structure, electrical terminations are mounted to the film. It was common in the prior art to place terminations at both ends of the flexible film element; however, putting terminations at both ends has proven disadvantageous because the electrical connection must still be routed to bring terminations together (from both ends). This requires an expensive complex structure, and furthermore, temperature increases can result in undue stresses in the film and terminations from differential expansion of the various materials. Such forces are undesirable and may lead to immediate disconnection or failures from cyclical stresses over time.

While routing the electrical connections is still practiced using the technique that U.S. Pat. No. 4,355,293 illustrates, it is now more typical to do the routing directly on the flexible element rather than using the housing structure. If the flexible element is a film material such as polyimide, polyester or similar material, it is not difficult to do the electrical routing on the film. A film such as Kapton™ is a typical suitable product for use as the flexible element.

Other patents relating to flexible elements and sensors that are herein incorporated by reference for pertinent and supporting information include:

U.S. Pat. No. 3,457,537, describes a flexible resistor element film.

U.S. Pat. No. 5,133,321, discloses an integrated throttle control and idle valve sensor.

U.S. Pat. No. 5,309,134, teaches of a flexible element sensor terminated at an angle off the axis of the rotor.

U.S. Pat. No. 5,385,068, describes an accelerator pedal with a flexible element sensor.

3. Problems with Related Art

Electrical traces mounted on a flexible film element do not tolerate tensional stresses, but can tolerate compressive stresses. As the flexible film element is wrapped about the rotor, the resistor and conductor traces are typically in a compressed state on the inside portion of the film. As shown in Related Art FIG. 1, a flexible film 10 is bent so that it puts the traces (not shown) in the detrimental tension state. Such a bend may be required to place terminations 20 at the desired location as illustrated by bend 36. Placing the resistor or conductor traces in tension can cause cracking that leads to failure of the sensor.

The problem is particularly acute when the sensor design requires terminations 20 to be placed at a location behind the main portion of the flexible film element 10 as shown in FIG. 2. In this instance, bend 36 is very abrupt and thus creates even greater tensional stress in the surface mounted traces (not shown).

It is noted that the above described problem, and other problems are solved through the subject invention and will become more apparent to one skilled in the art, from the detailed description of the subject invention.

SUMMARY OF THE PREFERRED EMBODIMENT

According to the preferred embodiment, a flexible element is provided wherein the direction of electrical traces on one side of the element can be altered without putting the traces under tension.

Another feature of the invention is to provide directional change by partially splitting the flexible element and continuing an electrical trace from one side of the split back along the other side.

Other features and objects of the preferred embodiment invention will become more clear from the following detailed description of the invention, taken with the accompanying drawings and claims, or may be learned by the practice of the invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the use of the accompanying drawings.

DETAILED DESCRIPTION OF THE PREFERRED EMBODIMENT

Figure 1:
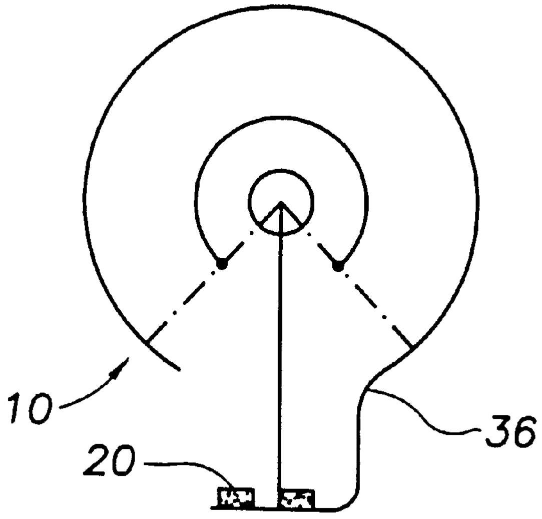
FIG. 1 RELATED ART
FIG. 1 is a cross-sectional top view of a related art sensor element and rotor.
Figure 2:
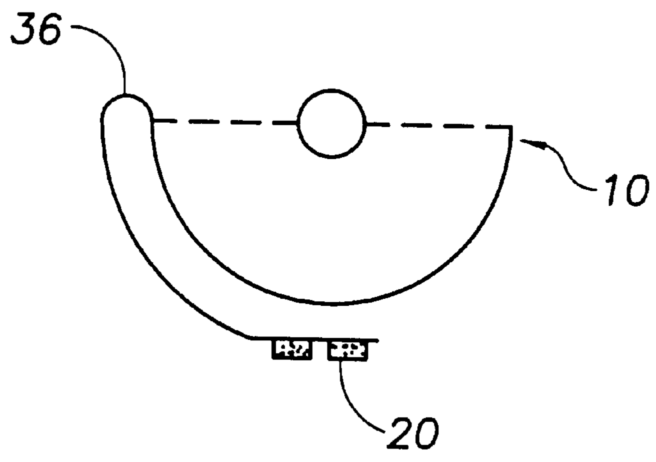
FIG. 2 RELATED ART
FIG. 2 is a cross-sectional top view of another related art sensor element and rotor with the terminations behind the element.
Figure 3:
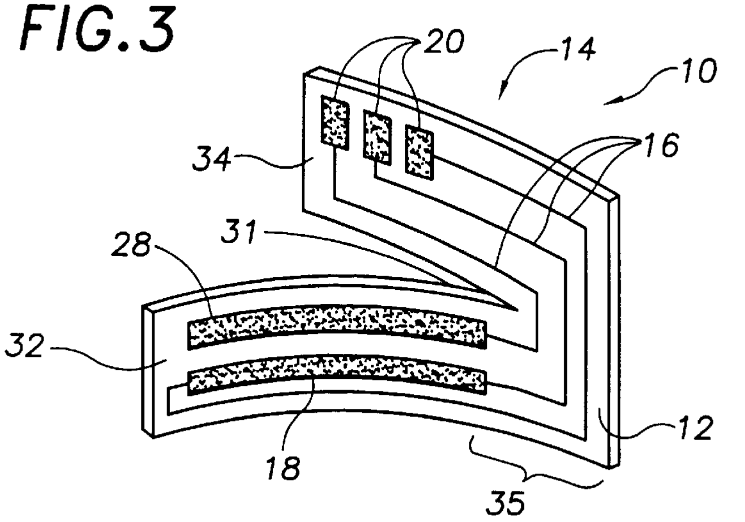
FIG. 3 is an isometric drawing of the flexible element according to the present invention.

The preferred embodiment of the invention is illustrated in FIG. 3. For the purposes of this disclosure, all extraneous or non-specific details relating to the sensor have been removed for ease of description and clarity. The flexible element of the present invention is generally identified by the numeral 10. A variety of well known and readily available materials such as polyimide, polyamide, epoxies, ureaformaldehydes, phenolics, etc. can be used as the base for the flexible element 10. For example, a film such as Kapton™ is quite suitable.

Referring to FIG. 3, there is an electrical circuit 14 formed on a first side 12 of flexible element 10. The electrical circuit 14 includes the following electrical elements: a resistor 18, conductive pads 28, conductive traces 16, and terminations 20. The electrical elements can be formed or placed on flexible element 10 through any well-known process such as screen printing, photo resist or vapor deposition.

The flexible element has a split 31 positioned lengthwise to form a first, second and third portion, element 32, 34 and 35 respectively. Split 31 does not extend completely through the length of flexible element 10. Conductive traces 16 extend across the third portion 35 of flexible element 10, which is not split, electrically connecting resistive element 18 and conductive pads 28 on first portion 32 of split 31 to terminations 20 on the second portion 34.

Figure 4:
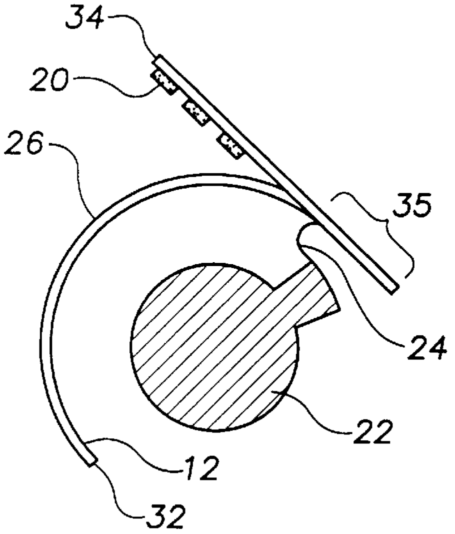
FIG. 4 illustrates a cross sectional top view of the flexible element of FIG. 3 with the rotor and contacts mounted thereon.

Referring to the cross sectional view of the flexible element in FIG. 4, side 12 of flexible element 10 remains in a compressive state as it would be placed in a sensor. It is noted, although the direction of electrical circuit 14 has been reversed so that terminations 20 can be extended behind a second side 26 of flexible element 10, there is no tension on side 12 at the third portion 35.

In this form, contactor 24 completes a connection of electrical circuit 14 by bridging the gap between resistor 18 and conductive pad 28. As rotor 22 is rotated about its axis the electrical resistance of circuit 14 is varied as contactor 24 is moved along resistance element 18 so that the position of the desired object (not shown) may be calculated.

Figure 5:
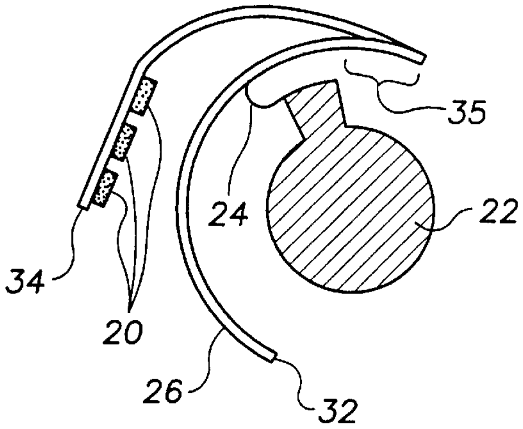
FIG. 5 is a cross sectional top view of the flexible element of FIG. 3 with the location of the terminations varied.

As shown in the cross sectional drawing of the element in FIG. 5, the location of terminations 20 can be varied by changing the length of second portion 34. Changing the length of second portion 34 does not affect the ability to maintain side 12 in compression.

Figure 6:
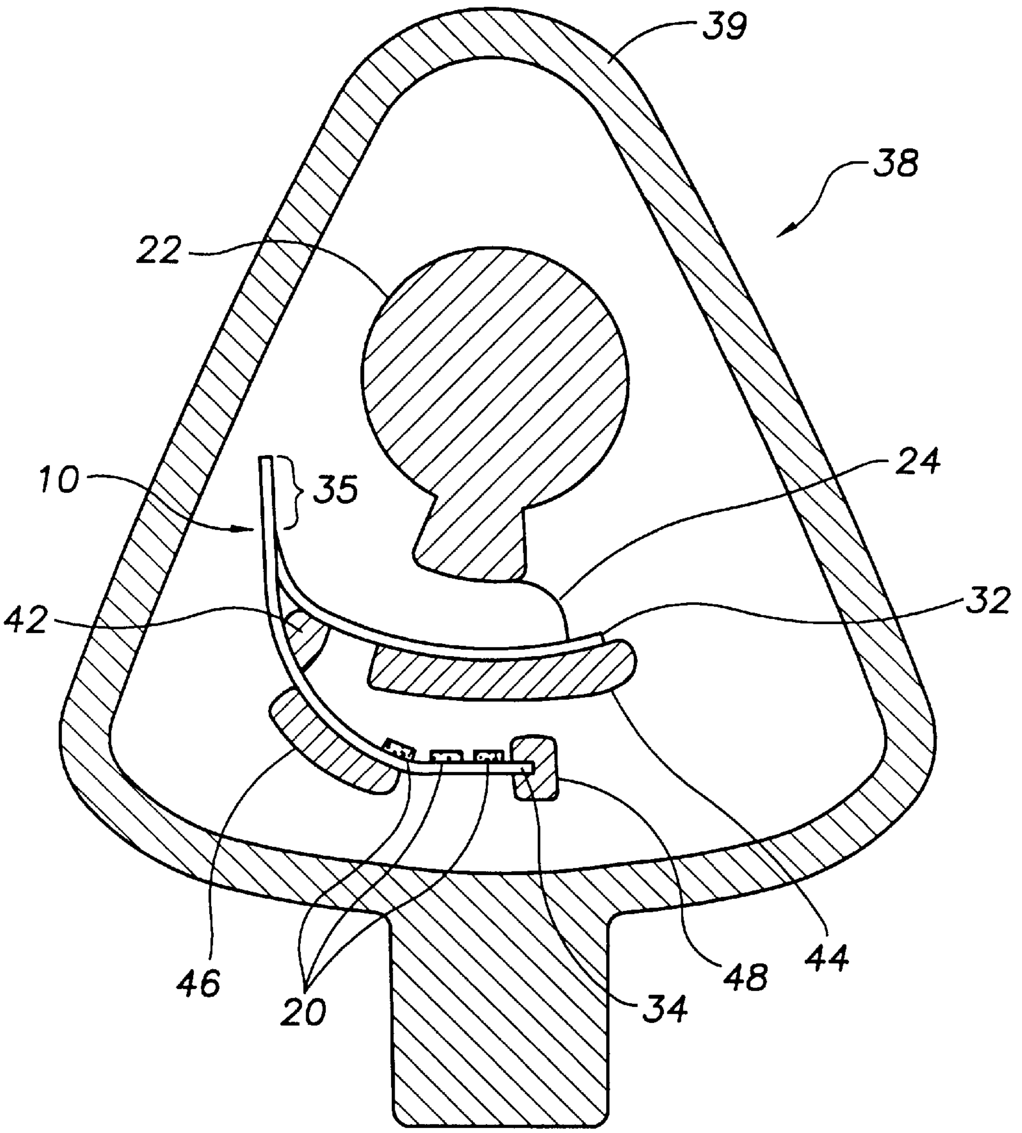
FIG. 6 is a top view of the flexible element of FIG. 3 mounted in a sensor with the cover removed.

FIG. 6 is a top view of a position sensor 38 with the cover removed. Flexible film element 10 is positioned in the housing 39 by using guides 42, 44, 46, and 48.

Although the present invention has been illustrated and described in connection with example embodiments, it will be understood that this is illustrative of the invention, and it is by no means restrictive thereof. It is reasonably to be suspected that those skilled in the art can make revisions and additions to the invention, and it is intended that such revisions and additions will be included within the scope of the following claims as equivalents of the invention.

I claim:

1. A rotary position sensor having a flexible film mounted circuit and a rotor having a contactor, comprising:

a) a housing having the rotor mounted therein;

b) a flexible film, having a top side and mounted within the housing, the flexible film including:

b1) a split traversing a length of the flexible film to form a first and second portion in the flexible film wherein only one of the first and second portions contact the contactor;

b2) a third portion of the flexible film, connecting the first and second portion;

b3) a first and second conductive path both mounted on the top side of the first portion;

b4) an input and output pad both mounted on the top side of the second portion; and b5) a first and second conductive trace, both connecting the input and output pad to the first and second conductive path, and both extending along the top side of the first, second, and third portion in non-tensioned state; and c) said first portion located at a different radial position with respect to said rotor than said second portion.

2. The device of claim 1, wherein a partial section of the first portion is positioned in an arcuate shape that creates a compressive force on the top side.

3. The device of claim 1, wherein a partial section of the second portion is positioned in an arcuate shape that creates a compressive force on the top side.

4. The device of claim 1, wherein a partial section of the third portion is positioned in an arcuate shape that creates a compressive force on the top side.

5. The device of claim 2, wherein a partial section of the second portion is positioned in an arcuate shape that creates a compressive force on the top side.

6. The device of claim 3, wherein a partial section of the third portion is positioned in an arcuate shape that creates a compressive force on the top side.

7. The device of claim 1, wherein the third portion is about perpendicular to the split, and located at one end of the flexible film.

8. The device of claim 1, wherein flexible film is positioned in the device so as not to create a tensional force on the top side of the flexible film.

9. The device of claim 8, wherein the second portion is positioned in the device so the top side of the second portion is located behind a back side of the first portion.

10. The device of claim 7, wherein the second portion is positioned in the device so the top side of the second portion is located behind a back side of the first portion.

11. The device of claim 6, wherein the second portion is positioned in the device so the top side of the second portion is located behind a back side of the first portion.

12. The device of claim 5, wherein the second portion is positioned in the device so the top side of the second portion is located behind a back side of the first portion.

13. The device of claim 4, wherein the second portion is positioned in the device so the top side of the second portion is located behind a back side of the first portion.

14. The device of claim 3, wherein the second portion is positioned in the device so the top side of the second portion is located behind a back side of the first portion.

15. The device of claim 2, wherein the second portion is positioned in the device so the top side of the second portion is located behind a back side of the first portion.

16. The device of claim 1, wherein the second portion is positioned in the device so the top side of the second portion is located behind a back side of the first portion.

17. A rotary position sensor, comprising:

a) a housing;

b) a rotor located in the housing;

c) a split flexible film defining first and second parts located in the housing and wrapped in a radial manner about the rotor and forming a radius of curvature wherein a first side of the flexible film is compressively stressed;

d) a resistor, a conductive pad, conductive traces, and terminations each located on the first side of the flexible film element;

e) contacting means, fixed to the rotor, for contacting the resistor and conductor and thereby causing a change in resistance between the terminations;

f) a first and second guide located in and protruding from said housing at different radial positions with respect to said rotor;

g) said one part located against said first guide and said second part located against said second guide; and h) said resistor located on said first part and said termination located on said second part.

* * * * *